United States Patent
Djelassi et al.

(10) Patent No.: US 9,966,943 B2
(45) Date of Patent: May 8, 2018

(54) SYSTEM AND METHOD FOR A HIGH-SIDE POWER SWITCH

(71) Applicant: Infineon Technologies AG, Neubiberg (DE)

(72) Inventors: Christian Djelassi, Villach (AT); Alexander Mayer, Treffen (AT); Robert Illing, Finkenstein (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 9 days.

(21) Appl. No.: 15/087,342

(22) Filed: Mar. 31, 2016

(65) Prior Publication Data

US 2017/0288662 A1 Oct. 5, 2017

(51) Int. Cl.
| | |
|---|---|
| H03K 3/00 | (2006.01) |
| H03K 17/687 | (2006.01) |
| H03K 17/0812 | (2006.01) |
| H03K 17/16 | (2006.01) |

(52) U.S. Cl.
CPC ..... H03K 17/687 (2013.01); H03K 17/08122 (2013.01); H03K 17/162 (2013.01)

(58) Field of Classification Search
CPC ............... H03K 17/082; H03K 17/687; H03K 17/0812; H03K 17/162; H02H 3/08; H02H 3/081; H02H 3/083; H02H 3/085; H02H 3/087; H02H 3/093; H02H 3/0935; H02H 3/10; H02H 3/105; H02M 3/156; H02M 3/1563; H02J 2007/0039

USPC .......................................................... 327/109
See application file for complete search history.

(56) References Cited

U.S. PATENT DOCUMENTS

| | | | |
|---|---|---|---|
| 7,760,006 B2 * | 7/2010 | Lavery ............. | H03K 19/00361 326/15 |
| 2003/0095368 A1* | 5/2003 | Daniels ............. | H03K 17/0822 361/93.9 |

* cited by examiner

*Primary Examiner* — Patrick Chen
(74) *Attorney, Agent, or Firm* — Slater Matsil, LLP (57) ABSTRACT

A system and method for a high-side power switch includes a gate driver configured to be coupled to a power switch, a voltage measurement circuit configured to be coupled directly to the power switch, a switch monitoring circuit configured to be coupled to the power switch, the switch monitoring circuit configured to measure an output current of the power switch, a current limitation circuit coupled to the gate driver and the switch monitoring circuit, the current limitation circuit configured to regulate gate-source voltage of the gate driver when the output current exceeds a threshold value, and a controller coupled to the current limitation circuit and the voltage measurement circuit, the controller configured to determine a mode of operation according to a startup voltage measured by the voltage measurement circuit during a startup sequence, the controller further configured to provide the threshold value to the current limitation circuit according to the mode of operation and a switch voltage measured by the voltage measurement circuit.

17 Claims, 7 Drawing Sheets

SYSTEM AND METHOD FOR A HIGH-SIDE POWER SWITCH

TECHNICAL FIELD

The present invention relates generally to power switches, and in particular embodiments, to techniques and mechanisms for a high-side power switch.

BACKGROUND

Smart power switches have grown in popularity in low-voltage applications that have medium-to-high current loads. Such applications include, e.g., modern automotive and industrial systems. Smart power switches include diagnostic abilities and protection features, particularly against short circuits or other types of current overloads. They may further include a temperature sensor and over-voltage protection features.

Smart power switches shut down when an overload event, such as a short-circuit, occurs. During a shutdown, a wire harness for the smart power switch may act as a resistive-inductive (RL) load, storing energy that a power transistor of the switch, e.g., a metal-oxide-semiconductor field-effect transistor (MOSFET), needs to dissipate. Dissipation of this stored energy can increase the temperature of the power switch, causing thermal stress that may damage the power switch.

SUMMARY OF THE INVENTION

Technical advantages are generally achieved by embodiments of this disclosure, which describe a high-side power switch.

In accordance with an embodiment, a device comprises a gate driver configured to be coupled to a power switch, a voltage measurement circuit configured to be coupled directly to the power switch, a switch monitoring circuit configured to be coupled to the power switch, the switch monitoring circuit configured to measure an output current of the power switch, a current limitation circuit coupled to the gate driver and the switch monitoring circuit, the current limitation circuit configured to regulate gate-source voltage of the gate driver when the output current exceeds a threshold value, and a controller coupled to the current limitation circuit and the voltage measurement circuit, the controller configured to determine a mode of operation according to a startup voltage measured by the voltage measurement circuit during a startup sequence, the controller further configured to provide the threshold value to the current limitation circuit according to the mode of operation and a switch voltage measured by the voltage measurement circuit.

In some embodiments, the current limitation circuit is further configured to disable the gate driver when regulating the gate-source voltage of the gate driver. In some embodiments, the threshold value is computed by the controller according to a sum of a continuous threshold and a discrete threshold, the continuous threshold being inversely proportion to the switch voltage, the discrete threshold being a first value when the switch voltage exceeds the startup voltage and a second value when the startup voltage exceeds the switch voltage, the second value being greater than the first value. In some embodiments, the continuous threshold has a maximum value, and wherein the discrete threshold includes a hysteresis. In some embodiments, the controller comprises a voltage comparator configured to generate a control current according to the switch voltage measured by the voltage measurement circuit, and a latch configured to store a startup current according to the startup voltage measured during the startup sequence, the latch configured to provide the threshold value according to whether the control current exceeds the startup current. In some embodiments, the controller further comprises a current source coupled to the latch, the current source configured to deliver the threshold value from the latch. In some embodiments, the device further comprises a logic circuit coupled to the gate driver and the controller, the logic circuit configured to restart the controller when the current limitation circuit regulates the gate driver. In some embodiments, restarting the controller comprises determining the mode of operation according to a second startup voltage measured by the voltage measurement circuit during the restart. In some embodiments, the device further comprises the power switch. In some embodiments, the power switch, the gate driver, the voltage measurement circuit, the switch monitoring circuit, the current limitation circuit, and the controller are disposed on a semiconductor substrate. In some embodiments, the current limitation circuit is a comparator.

In accordance with an embodiment, a method comprises storing a startup drain-source voltage of a power switch during a startup sequence, measuring a drain-source voltage of the power switch directly at a source terminal and a drain terminal of the power switch, producing a first threshold value as a continuous function of the measured drain-source voltage, producing a second threshold value as a discrete function of the measured drain-source voltage, measuring an output value of the power switch, and disabling the power switch when the output value of the power switch exceeds one of the first threshold value or the second threshold value.

In some embodiments, the method further comprises providing a combined threshold value, the combined threshold value being the first threshold value when the measured drain-source voltage is less than the startup drain-source voltage, the combined threshold value being a sum of the first threshold value and the second threshold value when the measured drain-source voltage is greater than the startup drain-source voltage, wherein the power switch is disabled when the output value of the power switch exceeds the combined threshold value, and wherein the combined threshold value is limited to a maximum threshold value. In some embodiments, the output value of the power switch is an output impedance. In some embodiments, the output value of the power switch is an output current. In some embodiments, storing the startup drain-source voltage of the power switch during the startup sequence comprises measuring an operating temperature of the power switch, and filtering the stored startup drain-source voltage according to the operating temperature. In some embodiments, filtering the stored startup drain-source voltage comprises reducing the stored startup drain-source voltage when the operating temperature exceeds a threshold. In some embodiments, the method further comprises filtering the stored startup drain-source voltage according to measured electromagnetic interference.

In accordance with an embodiment, a device comprises: a switch monitoring circuit configured to be coupled to a power switch, the switch monitoring circuit configured to produce a signal proportional to a measured value of the power switch, the switch monitoring circuit configured to provide a first cutoff threshold for the power switch, a filter coupled to the switch monitoring circuit and configured to filter the signal and produce a filtered signal, a latch coupled to the filter and configured to be coupled to a reset line, the latch configured to store the filtered signal in response to an assertion of the reset line, and a current source coupled to the latch and the switch monitoring circuit, the current source configured to provide a second cutoff threshold for the power switch when the signal exceeds the filtered signal stored in the latch.

In some embodiments, the filter comprises a temperature sensor, and wherein producing the filtered signal comprises reducing the signal when a temperature measured by the temperature sensor exceeds a threshold. In some embodiments, the measured value of the power switch is a source-drain voltage of the power switch, and wherein the switch monitoring circuit is directly coupled to a source terminal and a drain terminal of the power switch. In some embodiments, the device further comprises the power switch. In some embodiments, the power switch is disabled when the measured value of the power switch exceeds a sum of the first cutoff threshold and the second cutoff threshold, wherein the sum is limited to a maximum value. In some embodiments, the measured value of the power switch is one of resistance or current produced by the power switch.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

An overload event may cause a smart power switch to perform an emergency shutdown. Emergency shutdown is accomplished by quickly discharging the gate of a power transistor. Examples of overload events include exceeding an absolute temperature limit, exceeding a temperature increase limit, exceeding an overcurrent limit, and exceeding a source-drain voltage of the power transistor ($V_{DS}$) in the power switch after a power-on period.

Additionally, loads such as light bulbs and DC/DC converters may have a current inrush behavior due to an initial load seen by the power supply when initially powered. For example, the impedance of a light bulb is temperature-dependent, and can be several orders of magnitude lower than normal operating conditions when the filament of the light bulb is cold. Such initial loads may cause smart power switches to shut down shortly after initially powering the load, and will cause the power switch to continue shutting down until the load stops exhibiting current inrush behavior. Smart power switches perform several retries after a shutdown occurs, and may use a retry strategy that minimizes the initial power time and allows quick recovery if a shutdown occurs during normal operation. Repeated retries may result in repeated storing and dissipating of energy in the wire harness load, causing repeated increases in temperature that can wear the power switch over time. The energy stored and dissipated is directly proportional to the supply voltage ($V_S$).

Disclosed herein is a high-side smart power switch. Embodiment power switches measure $V_{DS}$ and reduce the short circuit output current tripping threshold ($I_{out\_trip}$) when $V_{DS}$ exceeds a threshold value. By reducing $I_{out\_trip}$ as $V_{DS}$ increases, the robustness of the protection mechanisms in the smart power switch is increased. Accordingly, the sensitivity of the smart power switch may be determined according to $$I_{out\_trip} = f(V_{DS})$$

In some embodiments, $V_{DS}$ is monitored in both a discrete and a continuous manner. In such embodiments, $V_{DS}$ is measured and stored discretely during initial stages of powering up, and $V_{DS}$ is measured continuously after initial power up. In such embodiments, $I_{out\_trip}$ is reduced by a fixed amount when $V_{DS}$ exceeds the stored initial reading, and $I_{out\_trip}$ is also gradually adjusted as $V_{DS}$ continuously increases manner.

In some embodiments, a filter is included with the smart power switch. The filter may reduce electromagnetic interference (EMI) that may otherwise cause the power switch to erroneously enter shutdown. Measuring and storing the initial value of $V_{DS}$ in a discrete manner during power-up may also reduce the effects of EMI on the power switch.

Various embodiments may achieve advantages. Measuring voltage changes on the source-drain voltage of the power transistor ($V_{DS}$), instead of other voltages such as the supply voltage ($V_S$), may allow for a measurement that is not influenced by ground shifts in the supply voltage. By filtering out EMI, the smart power switch may more reliable start up. Measuring $V_{DS}$ in a discrete manner at power-up may allow for more accurate measurement of $V_{DS}$, improving the reliability of controlling $I_{out\_trip}$. Further, measuring $V_{DS}$ in different manners may allow the power switch to account for more types of short circuit loads after startup.

Figure 1:
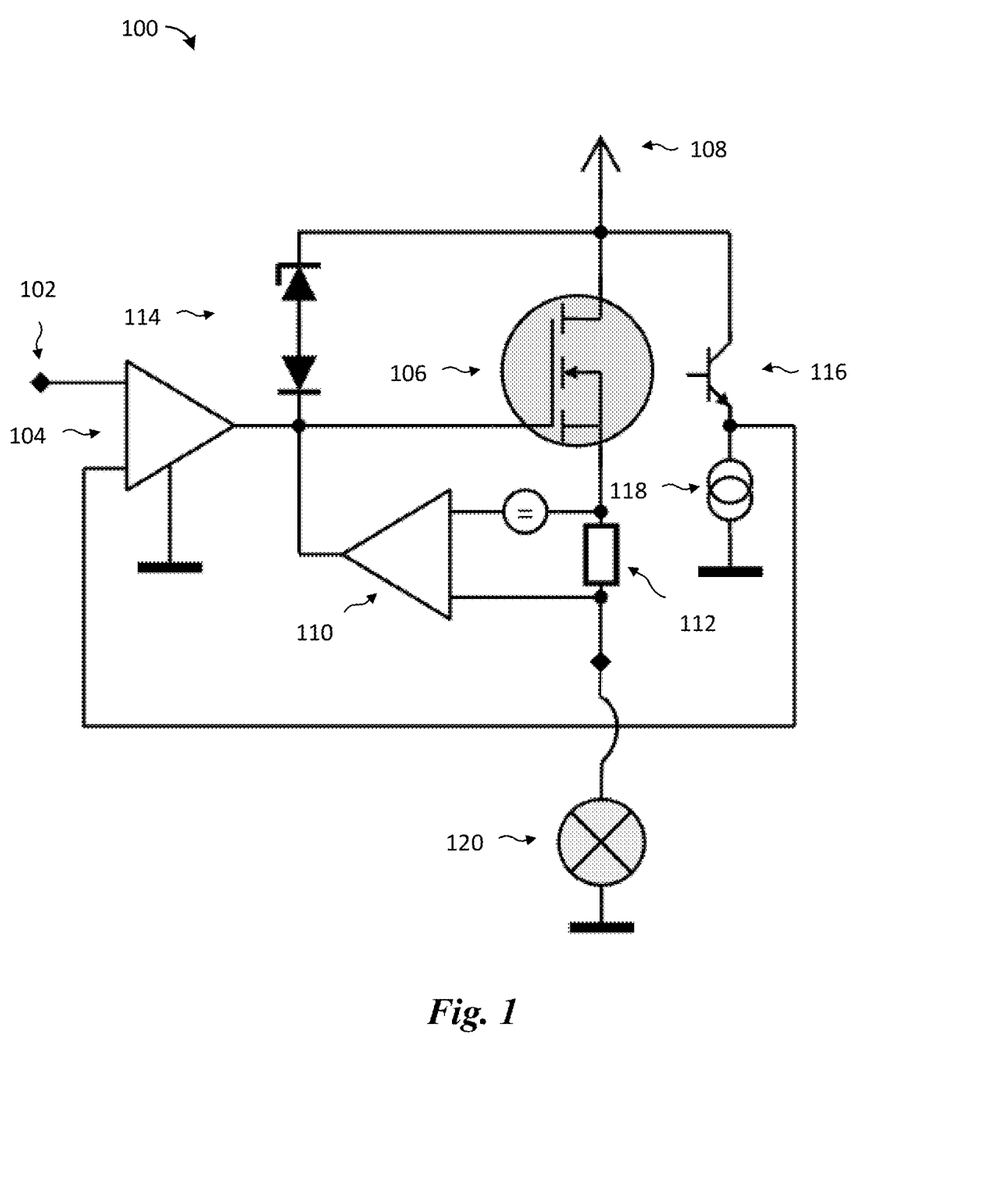
FIG. 1 is a circuit diagram of a smart power switch.

FIG. 1 is a circuit diagram of a smart power switch 100. The smart power switch 100 includes an input port 102, a gate driver/level shifter 104, a power MOSFET 106, a battery 108, a current limiter 110, a sensing impedance 112, a Zener diode clamp 114, a temperature sensor 116, a current sink 118, and a load 120. The devices in the smart power switch 100 may be disposed on, e.g., a semiconductor substrate (not illustrated). The input port 102 connects to an external device, such as a microcontroller, and is configured to enable and disable the smart power switch 100. The input port 102 is connected to the gate driver/level shifter 104, which enables and disables the smart power switch 100 by enabling and disabling the gate of the power MOSFET 106.

The power MOSFET 106 is connected to the battery 108 and controls current flow to devices powered by the smart power switch 100. The battery 108 may be any power source, such as a battery in an automobile. The power MOSFET 106 may be, e.g., a double-diffused metal-oxide-semiconductor (DMOS).

The current limiter 110 monitors the current delivered by the power MOSFET 106. The current limiter 110 may be, e.g., an operational amplifier (op-amp) or a comparator. Current may be monitored by including the sensing impedance 112 between the power MOSFET 106 and the load 120. The current limiter 110 measures the voltage drop across the sensing impedance 112 and determines the amount of current delivered according to the measured voltage drop. The current delivered by the power MOSFET 106 is adjusted by decreasing the gate voltage of the power MOSFET 106 as the current delivered increases. The Zener diode clamp 114 attempts to fix the difference in voltage between the drain and the gate of the power MOSFET 106 at a particular value, preventing the power MOSFET 106 against over-voltages.

The temperature sensor 116 is connected to the current sink 118 and the gate driver/level shifter 104, and is configured to disable the gate driver/level shifter 104 (and thus the power MOSFET 106) when the temperature sensed exceeds a given threshold. Accordingly, the smart power switch 100 is protected from overheating that may be caused by the power MOSFET 106 exceeding a safe level of current output.

The load 120 may be any load that is within the specified operating capabilities of the smart power switch 100. The load 120 may include resistive and inductive components. In embodiments where the smart power switch 100 is used in automotive applications, the load 120 may be, e.g., a light bulb. While particular embodiments contained herein are described with respect to automotive applications, it should be appreciated that embodiment smart power switches could be used in a wide variety of application.

Figure 2:
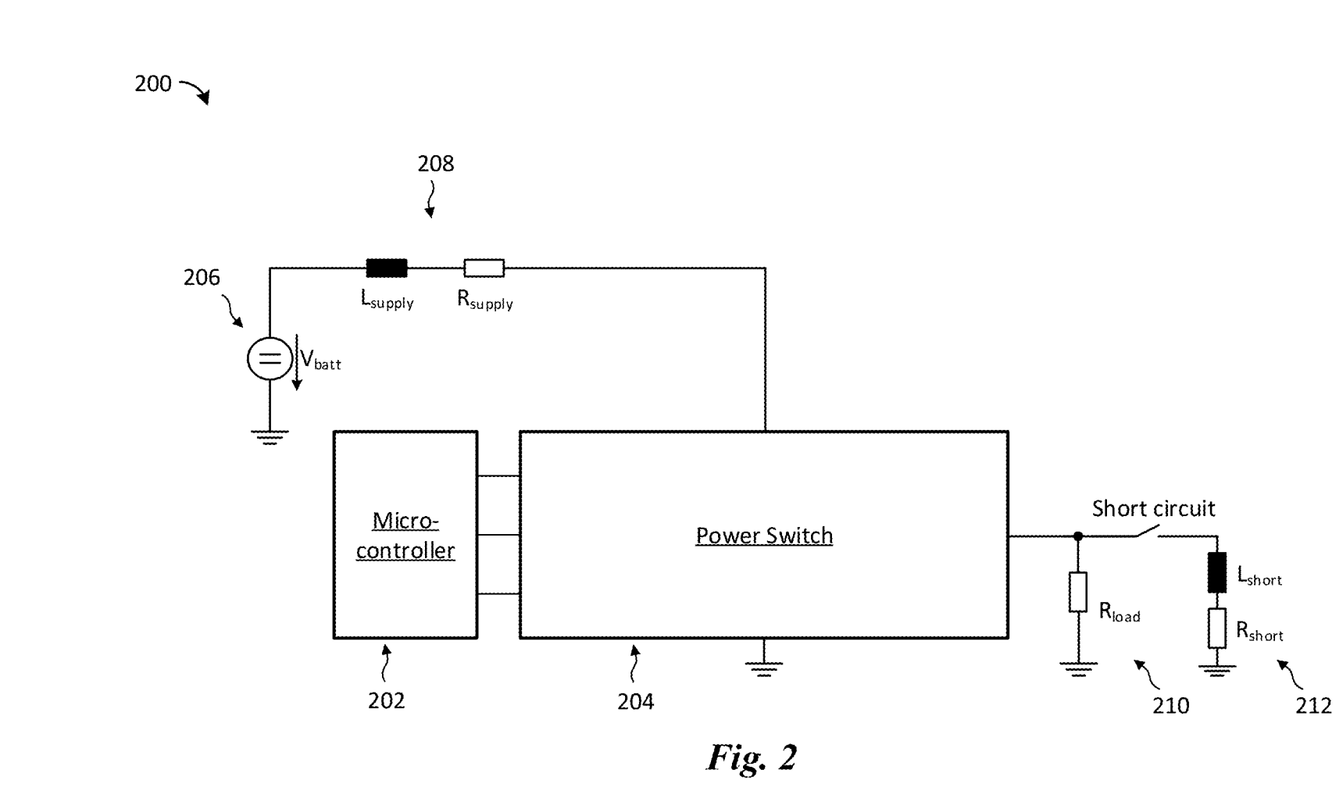
FIG. 2 is a block diagram of an automotive system.

FIG. 2 is a block diagram of an automotive system 200. The automotive system 200 includes a microcontroller 202, a smart power switch 204, a battery 206, a supply impedance 208, a device load 210, and a short circuit load 212. The microcontroller 202 is connected to the smart power switch 204 and is configured to enable and disable the smart power switch 204. The smart power switch 204 is powered by an external power supply, and thus can be switched on or off with logic-level inputs from the microcontroller 202.

The smart power switch 204 is powered by the battery 206. As discussed above, the battery 206 may be, e.g., a battery in an automotive application. The battery 206 has a supply impedance 208, which may include resistive ($R_{supply}$) and inductive portions ($L_{supply}$). Portions of the supply impedance 208 may be attributed to a wire harness connecting the smart power switch 204 to the battery 206. When the smart power switch 204 is turned off in an emergency shutdown, the inductive portions $L_{supply}$ of the supply impedance 208 may contain stored magnetic energy that is discharged and generates heat when dissipated. Fatigue caused by repeated discharges can wear and damage the smart power switch 204.

The smart power switch 204 powers the device load 210. As discussed above, the device load 210 may be, e.g., a light bulb in an automotive application. When a short circuit occurs, the short circuit formed by the smart power switch 204 may be represented as the short circuit load 212. The short circuit load 212 may include resistive ($R_{short}$) and inductive portions ($L_{short}$).

Figure 3:
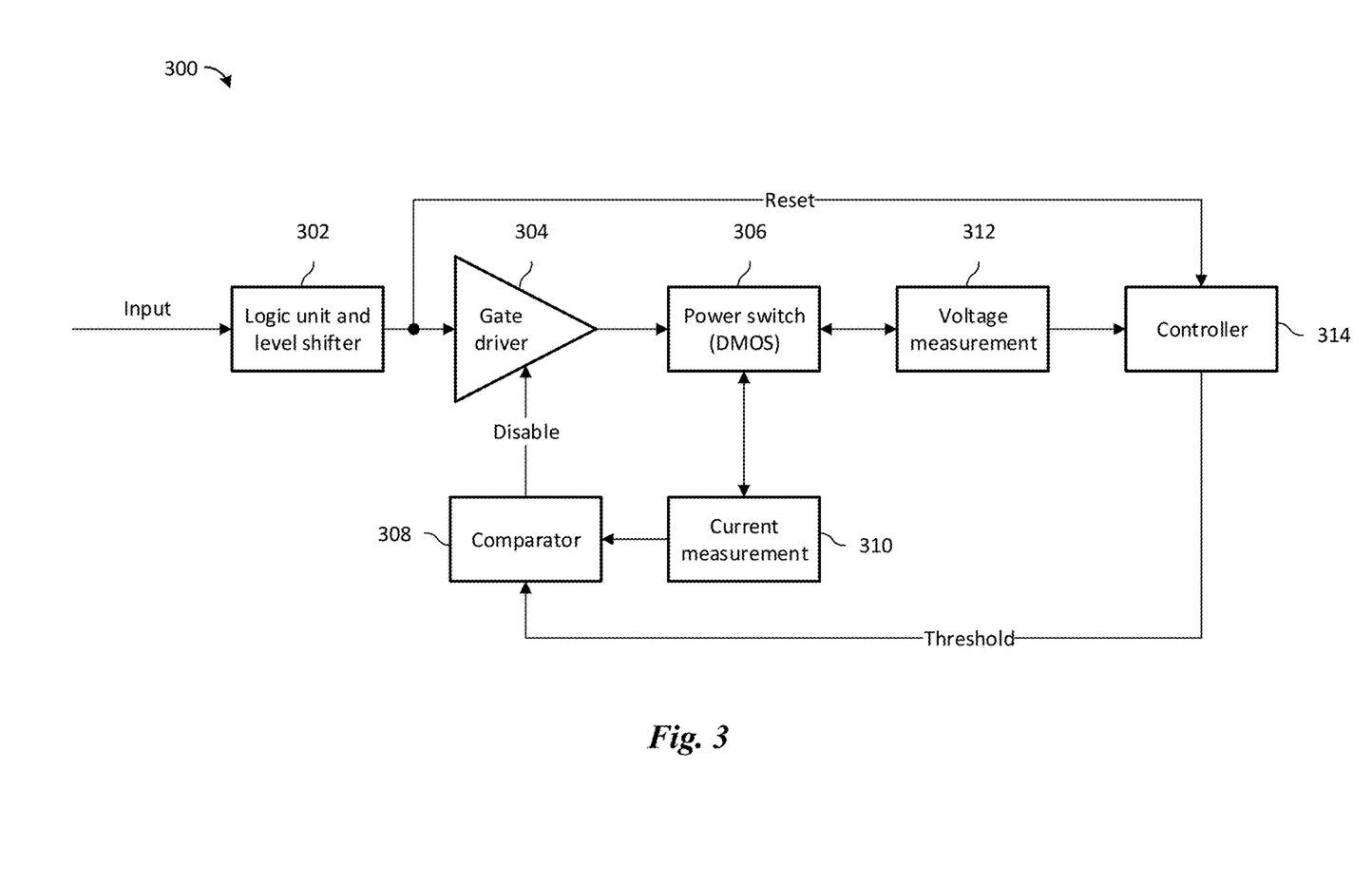
FIG. 3 is a block diagram of a smart power switch.

FIG. 3 is a block diagram of a smart power switch 300. The smart power switch 300 includes a logic unit/level shifter 302, a gate driver 304, a power switch 306, a comparator 308, a current measurement circuit 310, a voltage measurement circuit 312, and a controller 314. An input is coupled to the logic unit/level shifter 302. The input is a logic-level input, and may be coupled to, e.g., a microcontroller.

The logic unit/level shifter 302 is coupled to the gate driver 304 and is configured to turn the smart power switch 300 on and off by enabling and disabling the gate driver 304. The gate driver 304 accepts the low-power input from the logic unit/level shifter 302 and produces a high-current drive input for the power switch 306. The gate driver 304 may comprise, e.g., an amplifier.

The power switch 306 is coupled to the gate driver 304. The power switch 306 is connected to the battery and the load (not shown in FIG. 3), and powers the load when enabled by the gate driver 304. The power switch 306 may be, e.g., a DMOS device. Alternatively, other device types may be used.

The comparator 308 controls the gate driver 304. The comparator 308 measures the output current of the power switch 306 with the current measurement circuit 310. The comparator disables the gate driver 304 if the current measured by the current measurement circuit 310 exceeds a threshold value that is provided to the comparator 308. The comparator 308 may be, e.g., an ordinary or high-gain differential amplifier.

The voltage measurement circuit 312 is coupled to the power switch 306. The voltage measurement circuit 312 may be directly coupled to the drain and source of the power switch 306, so that indirect measurements of the power switch 306 are not necessary. Accuracy of voltage measurements may thus be improved. The voltage measurement circuit 312 allows the controller 314 to measure the source-drain voltage ($V_{DS}$) of the power switch 306.

The controller 314 provides the threshold value to the comparator 308. The controller 314 is configured to read and store an initial value ($V_{startup}$) for $V_{DS}$ at startup. $V_{startup}$ is stored in a component of the controller 314, such as a latch. Accordingly, the controller 314 is coupled to an output of the logic unit/level shifter 302 along with the gate driver 304. When the logic unit/level shifter 302 is enabled, the output signal may be used by the controller 314 as a reset signal, causing the controller 314 to latch a new value for $V_{startup}$.

While operating, the controller 314 provides the threshold value to the comparator 308. In some embodiments, the controller 314 provides the threshold value according to the source-drain voltage $V_{DS}$ read by the voltage measurement circuit 312. In such embodiments, the threshold value produced is directly proportional to the source-drain voltage $V_{DS}$. Higher or lower threshold values cause the short circuit output current tripping threshold ($I_{out\_trip}$), of the smart power switch 300 to be lower or higher, respectively. Accordingly, the smart power switch 300 enters emergency restart at higher source-drain voltages $V_{DS}$. The controller 314 may include, e.g., a comparator to produce the threshold value from the source-drain voltage $V_{DS}$.

In some embodiments, the controller 314 provides the threshold value according to the source-drain voltage $V_{DS}$ and the startup voltage $V_{startup}$. In such embodiments, the controller 314 may produce a first threshold $I_{t1}$ that is proportional to the source-drain voltage $V_{DS}$ (discussed above), and produce a second threshold $I_{t2}$ according to whether the source-drain voltage $V_{DS}$ exceeds the startup voltage $V_{startup}$. The controller 314 may then sum the first threshold $I_{t1}$ and the second threshold $I_{t2}$ to produce the threshold value for the comparator 308.

The controller 314 produces the second threshold $I_{t2}$ by providing a lower second threshold $I_{t2\_1}$ when the source-drain voltage $V_{DS}$ is greater than the startup voltage $V_{startup}$, and a higher second threshold $I_{t2\_h}$ when the source-drain voltage $V_{DS}$ is less than the startup voltage $V_{startup}$. In some embodiments, a hysteresis is applied when determining whether the startup voltage $V_{startup}$ is greater than or less than the measured source-drain voltage $V_{DS}$. The level of the second threshold $I_{t2}$ may determine whether the first threshold $I_{t1}$ influences $I_{out\_trip}$. When the second threshold $I_{t2}$ is lower, the threshold value provided to the comparator 308 may be low enough that the first threshold $I_{t1}$ does not influence the operation of the power switch. When the second threshold value is higher, the threshold value provided to the comparator 308 may then be sufficiently influenced by the first threshold $I_{t1}$ such that the operation of the power switch is affected by the first threshold $I_{t1}$. In some embodiments, the second threshold $I_{t2}$ may be produced from one of several threshold values.

Figure 4A:
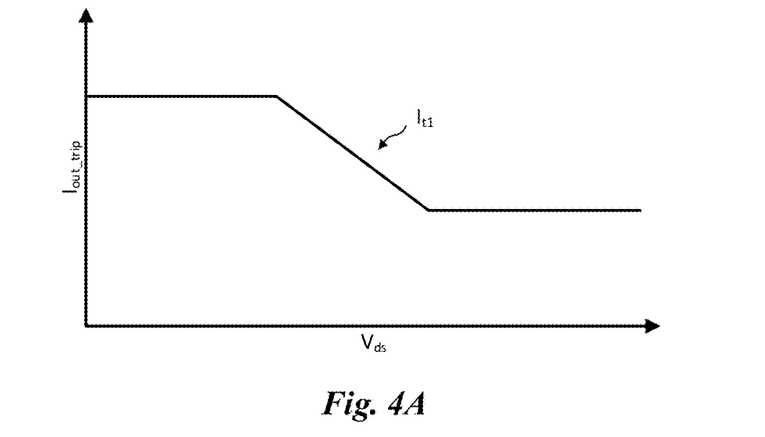
FIGS. 4A-4C are graphs of short circuit output current tripping threshold versus source-drain voltage, according to some embodiments.
Figure 4B:
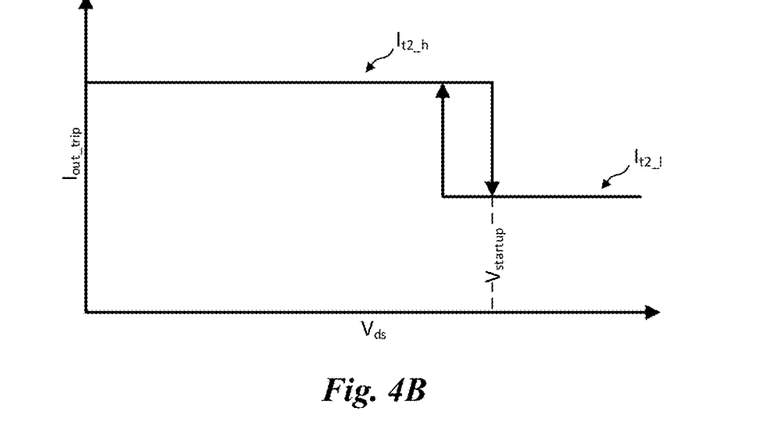
Figure 4C:
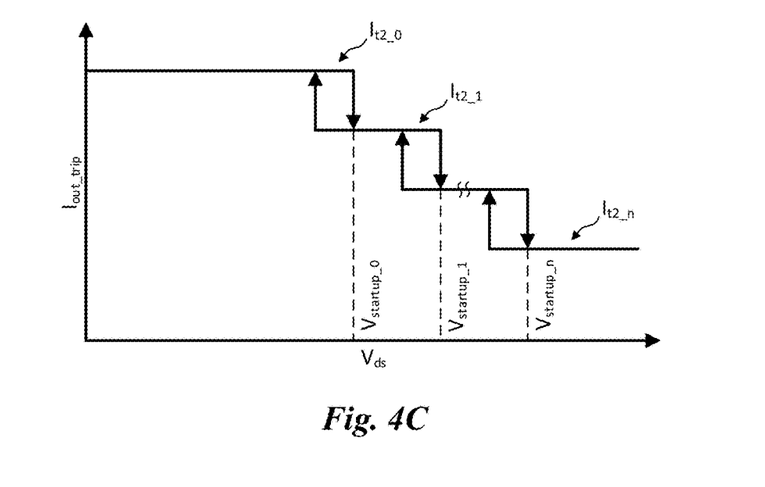

FIGS. 4A-4C are graphs of the short circuit output current tripping threshold $I_{out\_trip}$ versus the source-drain voltage $V_{DS}$ for some embodiments. FIG. 4A illustrates $I_{out\_trip}$ as a continuous function of the source-drain voltage $V_{DS}$. As can be seen, $I_{out\_trip}$ gradually decreases as $V_{DS}$ increases, up to a threshold. FIG. 4A may be indicative of embodiments where the controller 314 provides the first threshold $I_{t1}$ according to the source-drain voltage $V_{DS}$ read by the voltage measurement circuit 312. FIG. 4B illustrates $I_{out\_trip}$ as a discrete function of the source-drain voltage $V_{DS}$. As can be seen, $I_{out\_trip}$ abruptly decreases when $V_{DS}$ crosses a threshold, with some hysteresis. FIG. 4B may be indicative of embodiments where the controller 314 provides the second threshold $I_{t2}$ according to the source-drain voltage $V_{DS}$ and the startup voltage $V_{startup}$. FIG. 4C illustrates $I_{out\_trip}$ as a discrete function of the source-drain voltage $V_{DS}$ in embodiments where the second threshold $I_{t2}$ is produced from one of several threshold values. For example, the second threshold $I_{t2}$ is stepped down from threshold $I_{t2\_0}$ to $I_{t2\_n}$ as the source-drain voltage $V_{DS}$ increases from the startup voltage $V_{startup\_0}$ to $V_{startup\_n}$.

Figure 5:
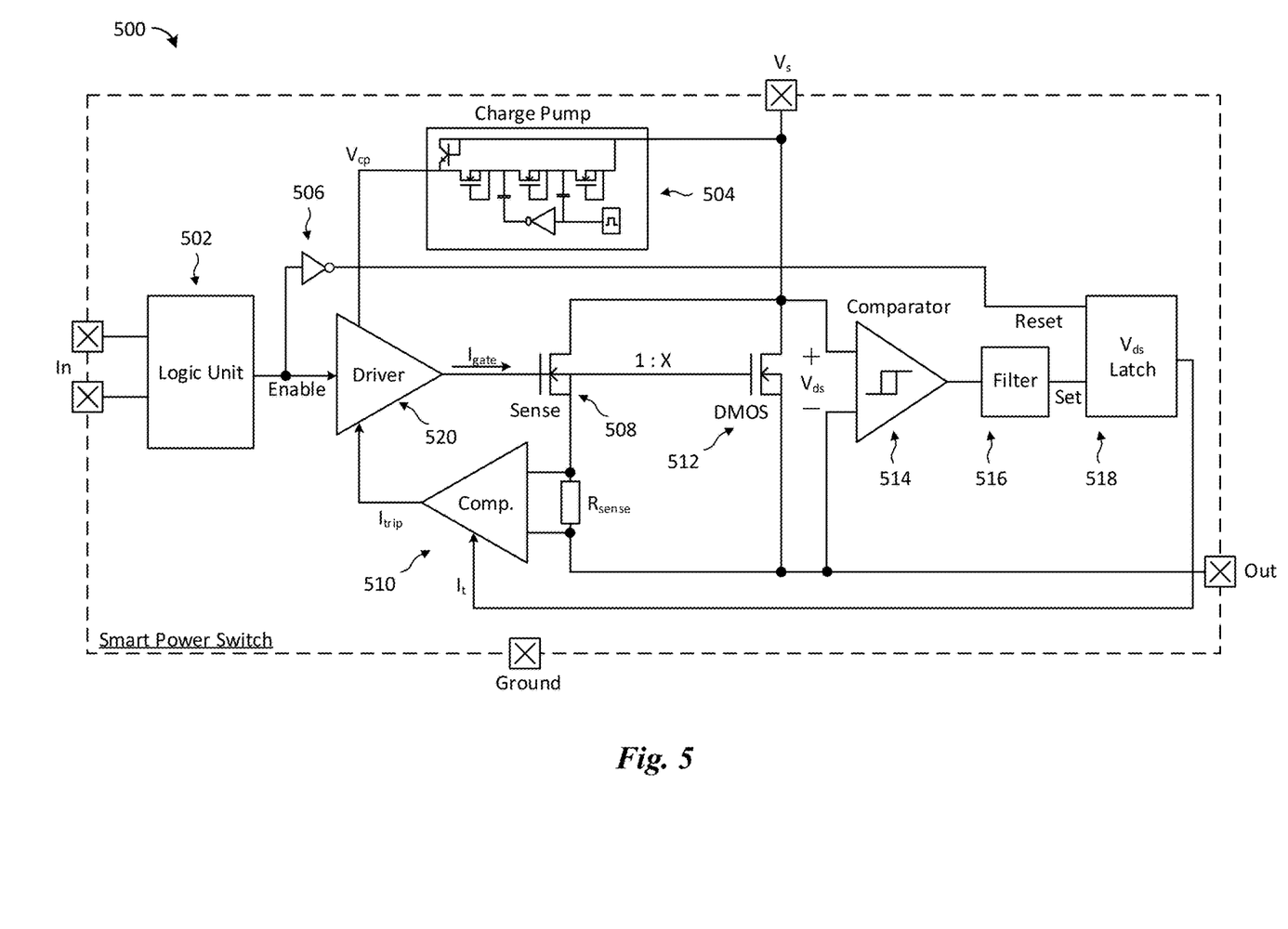
FIG. 5 is a circuit diagram of a smart power switch.

FIG. 5 is a circuit diagram of a smart power switch 500. The smart power switch 500 includes a logic unit 502, a charge pump 504, an inverter 506, a sensing DMOS 508, a trip current comparator 510, a power DMOS 512, a source-drain voltage comparator 514, a filter 516, a latch 518 and a gate driver 520. The logic unit 502 is an application-specific integrated circuit (ASIC) that may be coupled to an external device, such as a microcontroller. The external device may then enable and disable the smart power switch 500 with a logic-level signal, which in turn delivers power to a load connected to the smart power switch 500. The gate driver 520 is coupled to the charge pump 504, which is powered by a supply voltage $V_S$ and provides DC power to the gate driver 520 so that it may drive the sensing DMOS 508 and the power DMOS 512.

The inverter 506 is coupled to an enable line of the logic unit 502. The enable line is coupled to the gate driver 520, which turns the smart power switch 500 on and off. When the logic unit 502 resets the smart power switch 500, it turns off the enable line. The inverter 506 is between the enable line and a reset switch of the latch 518. Accordingly, when the logic unit 502 triggers a reset, the inverter 506 enables the reset switch of the latch 518, causing the latch 518 to store a new value.

The sensing DMOS 508 is coupled to the gate driver 520, which provides a gate current $I_{gate}$ to the sensing DMOS 508 and the power DMOS 512. The sensing DMOS 508 produces a current that is a ratio, 1:X, of the current delivered by the power DMOS 512. The current produced by the sensing DMOS 508 is delivered to an impedance $R_{sense}$, which generates a voltage across the impedance $R_{sense}$. The trip current comparator 510 (discussed below) measures this voltage difference and thus produces a signal that is a function of the current delivered by the power DMOS 512.

The trip current comparator 510 determines the current delivered by the power DMOS 512 according to the measurement performed by the sensing DMOS 508, and provides a trip current $I_{trip}$ to the gate driver 520 while the current delivered by the power DMOS 512 is less than a threshold current $I_t$. The trip current comparator 510 is thus configured to turn off or reset the smart power switch 500 when the current delivered by the power DMOS 512 exceeds the threshold current $I_t$.

The power DMOS 512 is powered by the supply voltage $V_S$ and delivers current to devices coupled to the output of the smart power switch 500. The power DMOS 512 is driven by the gate driver 520. The threshold current $I_t$ provided to the trip current comparator 510 is generated as a function of the source-drain voltage $V_{DS}$ of the power DMOS 512.

The source-drain voltage comparator 514, filter 516, and latch 518 are configured to provide the threshold current $I_t$ as a function of the source-drain voltage $V_{DS}$. The source-drain voltage comparator 514 is directly coupled to the source and drain terminals of the power DMOS 512. In some embodiments, because the source-drain voltage comparator 514 may directly measure the source-drain voltage $V_{DS}$, the threshold current $I_t$ may be produced without the need for separate measuring circuits, which may be influenced by fluctuating ground voltages. Accuracy of voltage measurement may thus be improved. In some embodiments, the source-drain voltage comparator 514 produces a digital output.

The filter 516 filters the measured digital output of the comparator 514 in order to improve electromagnetic compatibility (EMC). The filter 516 may be, e.g., a RC low pass filter, an integrator, or a delay circuit. In some embodiments, the time constant of the filter 516 is smaller than the amount of time it takes the smart power switch 500 to reach the gate-source threshold voltage $V_{th}$ of the power DMOS 512 during a turn on sequence.

The latch 518 may be a set-reset (SR) flip-flop, although any bistable multivibrator could be used. In some embodiments, the latch 518 is active high. In such embodiments, the latch 518 stores the value on the set line when the reset line is logic low (e.g., not triggered). The reset line for the latch 518 is triggered by the inverter 506 while the enable line of the gate driver 520 is at logic low (e.g., not triggered). The enable line of the gate driver 520 is at logic low when the smart power switch 500 is turned off. During a startup sequence (e.g., when the enable line of the gate driver 520 is set to a logic high), the initial source-drain voltage $V_{DS}$ of the power DMOS 512 is measured by the source-drain voltage comparator 514, and the measured value is filtered by the filter 516 then stored in the latch 518. The source-drain voltage $V_{DS}$ produced by the power DMOS 512 is most stable during the startup sequence, and may fluctuate as the current consumed by the load varies. Storing a value for the initial source-drain voltage $V_{DS}$ in the latch 518 and providing the threshold current $I_t$ to the trip current comparator 510 according to the initial source-drain voltage $V_{DS}$ allows generation of a threshold current $I_t$ that more accurately reflects safe output current thresholds, above which damage may be caused to the smart power switch 500.

Figure 6:
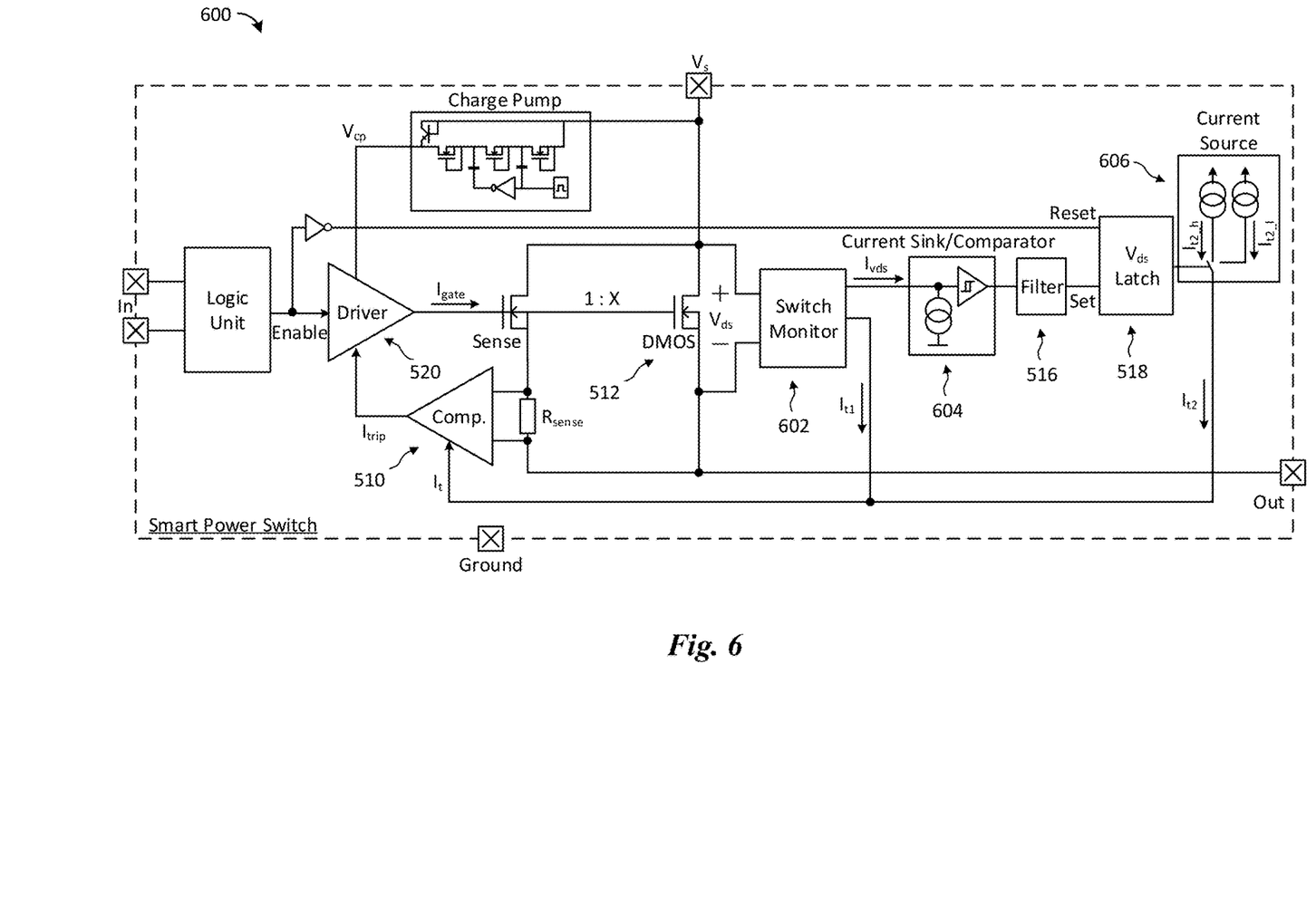
FIG. 6 is a circuit diagram of a smart power switch.

FIG. 6 is a circuit diagram of a smart power switch 600. The smart power switch 600 is similar to the smart power switch 500, with the inclusion of a switch monitoring circuit 602, a current sink/comparator 604, and a current source 606. In the smart power switch 600, the threshold current $I_t$ provided to the trip current comparator 510 is a sum of a continuous threshold current $I_{t1}$ and a discrete threshold current $I_{t2}$. The continuous threshold current $I_{t1}$ is an inversely proportional function of the source-drain voltage $V_{DS}$, and the discrete threshold current $I_{t2}$ is provided when operating in certain modes.

The switch monitoring circuit 602 measures the source-drain voltage $V_{DS}$ of the power DMOS 512. Like the source-drain voltage comparator 514, the switch monitoring circuit 602 is directly coupled to the power DMOS 512 so that voltage measurement accuracy may be improved. The switch monitoring circuit 602 may comprise, e.g. a voltage-to-current converter, which may include a resistor and one or more current mirrors, in order to produce several signals that are functions of the measured source-drain voltage $V_{DS}$ of the power DMOS 512. In some embodiments, the switch monitoring circuit 602 produces a continuous threshold current $I_{t1}$ and a measured current $I_{VDS}$ that are functions of the source-drain voltage $V_{DS}$, e.g., $$I_{t1}=I_{VDS}=f(V_{DS}).$$

In some embodiments, the threshold current $I_{t1}$ is inversely proportional to the source-drain voltage $V_{DS}$, and the measured current $I_{VDS}$ are directly proportional to the source-drain voltage $V_{DS}$.

The continuous threshold current $I_{t1}$ is supplied to the trip current comparator 510 as part of the threshold current $I_t$. The continuous threshold current $I_{t1}$ is inversely proportional to the source-drain voltage $V_{DS}$. As the source-drain voltage $V_{DS}$ increases, the continuous threshold current $I_{t1}$ decreases, which in turn increases the sensitivity of the smart power switch 600 to overcurrent situations. The continuous threshold current $I_{t1}$ may have an upper limit, e.g., there may be clipping on the signal such that the smart power switch 600 does not exceed a maximum overcurrent sensitivity for the continuous threshold current $I_{t1}$.

The measured current $I_{VDS}$ is inputted to the current sink/comparator 604, which has an output connected to the filter 516. The current sink/comparator 604 includes a current sink that stores a current $I_{startup}$ proportional to $V_{startup}$, and a comparator, which compares the measured current $I_{VDS}$ to the stored current $I_{startup}$. The output of the comparator is a digital signal. If the measured current $I_{VDS}$ is greater than the stored current $I_{startup}$, the comparator output is set to logic high. The comparator output is stored in the latch 518, which is set when the set line is logic high at startup and the reset line is logic low. In some embodiments, the current sink/comparator 604 further comprises a comparator for time discretization. The stored current $I_{startup}$ is compared to the measured current $I_{VDS}$ during normal operation, which accomplishes comparison of the source-drain voltage $V_{DS}$ to the startup voltage $V_{startup}$.

The current source 606 is configured to supply a discrete threshold current $I_{t2}$ to the trip current comparator 510 as part of the threshold current $I_t$. The discrete threshold current $I_{t2}$ is a function of the value stored in the latch 518, and is sourced from the current source 606. The value of the discrete threshold current $I_{t2}$ is controlled by the output of the latch 518. The current source 606 is set to a high current threshold $I_{t2\_h}$ when the latch 518 is not set, or to a low current threshold $I_{t2\_l}$ when the latch 518 is set. The discrete threshold current $I_{t2}$ is supplied to the same node that the continuous threshold current $I_{t1}$ is supplied, thus resulting in the threshold current $I_t$ being a sum of the continuous threshold current $I_{t1}$ and the discrete threshold current $I_{t2}$.

Figure 7:
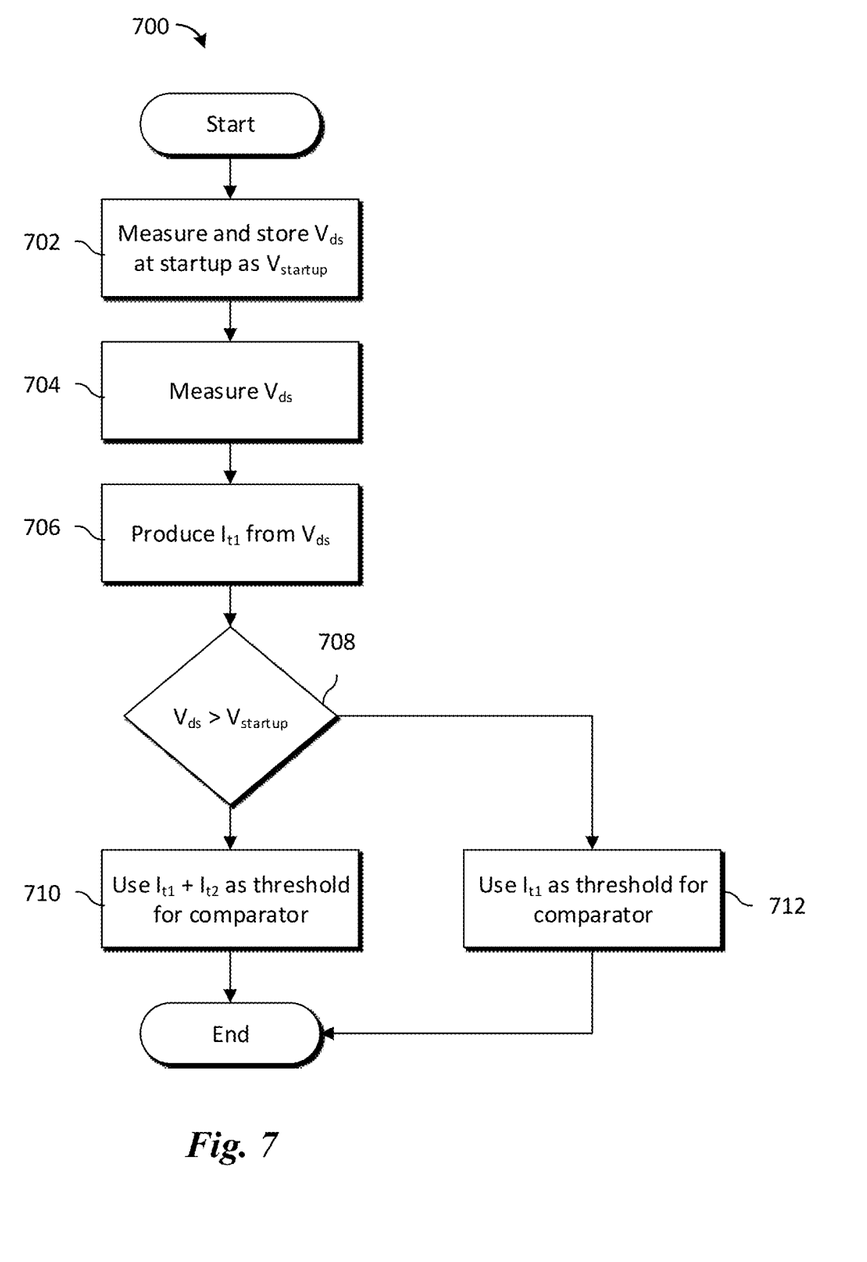
FIG. 7 is a flow diagram of an overcurrent protection method.

FIG. 7 is a flow diagram of an overcurrent protection method 700. The overcurrent protection method 700 may be indicative of operations occurring in the smart power switch 600. The overcurrent protection method 700 begins by measuring and storing a value $V_{startup}$ for the source-drain voltage $V_{DS}$ of the power switch during a startup sequence (step 702). The value stored may be a current that is proportional to the source-drain voltage $V_{DS}$, and the value may be stored in a latch. During normal operations, the source-drain voltage $V_{DS}$ is measured (step 704). The source-drain voltage $V_{DS}$ is used to produce a continuous threshold current $I_{t1}$ that is inversely proportional to the source-drain voltage $V_{DS}$ (step 706). The continuous threshold current $I_{t1}$ may be a clipped signal. If the measured source-drain voltage $V_{DS}$ exceeds the stored voltage $V_{startup}$ (step 708), then the threshold current $I_t$ supplied to the trip current comparator is the sum of the continuous threshold current $I_{t1}$ and a discrete threshold current $I_{t2}$ (step 710). The discrete threshold current $I_{t2}$ supplied is a function of the stored voltage $V_{startup}$. If the measured source-drain voltage $V_{DS}$ does not exceed the stored voltage $V_{startup}$ (step 708), then the discrete threshold current $I_{t2}$ is not supplied, and the threshold current $I_t$ supplied to the trip current comparator is threshold current $I_{t1}$ (step 712).

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A device comprising:
a gate driver configured to be coupled to a power switch;
a voltage measurement circuit configured to be coupled to a drain terminal and a source terminal of the power switch, the voltage measurement circuit configured to measure a source-drain voltage of the power switch;
a current limitation circuit coupled to the gate driver, the current limitation circuit configured to measure an output current of the power switch, and to regulate a gate-source voltage of the power switch through the gate driver when the output current exceeds a threshold value; and
a controller coupled to the current limitation circuit and the voltage measurement circuit, the controller configured to store a first value measured by the voltage measurement circuit during a startup sequence of the power switch, to determine a mode of operation according to the first value stored during the startup sequence, and to provide the threshold value to the current limitation circuit according to the mode of operation and a second value measured by the voltage measurement circuit during operation of the power switch.

2. The device of claim 1, wherein the current limitation circuit is further configured to disable the gate driver when regulating the gate-source voltage of the power switch.

3. The device of claim 1, wherein the threshold value is computed by the controller according to a sum of a continuous threshold and a discrete threshold, the continuous threshold being inversely proportion to the second value measured during operation of the power switch, the discrete threshold being directly proportional to a difference between the second value and the first value.

4. The device of claim 3, wherein the continuous threshold has a maximum value, and wherein the discrete threshold includes a hysteresis.

5. The device of claim 1, further comprising:
a logic circuit coupled to the gate driver and the controller, the logic circuit configured to restart the controller with a restart sequence when the current limitation circuit regulates the gate-source voltage of the power switch.

6. The device of claim 5, wherein the controller is configured to store a third value measured by the voltage measurement circuit during the restart sequence, and to redetermine the mode of operation according to the third value stored during the restart sequence.

7. The device of claim 1, further comprising the power switch.

8. The device of claim 7, wherein the power switch, the gate driver, the voltage measurement circuit, the current limitation circuit, and the controller are disposed on a semiconductor substrate.

9. The device of claim 1, wherein the current limitation circuit is a current comparator.

10. The device of claim 1, wherein the voltage measurement circuit comprises a voltage comparator configured to measure the source-drain voltage and generate a control current according to the second value measured during operation of the power switch, wherein the controller comprises:
a latch configured to store a startup current according to the first value stored during the startup sequence, and to provide the threshold value according to whether the control current exceeds the startup current.

11. The device of claim 10, wherein the voltage comparator is directly coupled to the drain terminal and the source terminal of the power switch.

12. The device of claim 1, wherein the voltage measurement circuit comprises a switch monitoring circuit configured to measure the source-drain voltage, to generate a first control current directly proportional to the second value measured during operation of the power switch, and to generate a second control current inversely proportional to the second value measured during operation of the power switch, wherein the controller comprises:
a current source configured to produce a third control current, wherein the threshold value is the sum of the first control current and the third control current; and
a latch coupled to the current source, the latch configured to store a startup current according to the first value stored during the startup sequence, and to control the current source to produce the third control current according to whether the second control current exceeds the startup current.

13. The device of claim 12, wherein the current source is configured to produce a high value for the third control current when the second control current exceeds the startup current, and to produce a low value for the third control current when the second control current does not exceed the startup current.

14. The device of claim 12, wherein the switch monitoring circuit is directly coupled to the drain terminal and the source terminal of the power switch.

15. The device of claim 12, wherein the controller further comprises:
a filter coupled to the switch monitoring circuit and configured to filter the second control current and produce a filtered signal.

16. The device of claim 15, wherein the filter comprises a temperature sensor, and wherein producing the filtered signal comprises reducing the second control current when a temperature measured by the temperature sensor exceeds a threshold.

17. A method comprising:
measuring, by a voltage measurement circuit, a source-drain voltage of a power switch, the voltage measurement circuit configured to be coupled to a drain terminal and a source terminal of the power switch;
storing, by a controller, a first value measured by the voltage measurement circuit during a startup sequence of the power switch, the controller coupled to the voltage measurement circuit;
determining, by the controller, a mode of operation according to the first value stored during the startup sequence;
providing, by the controller, a threshold value according to the mode of operation and a second value measured by the voltage measurement circuit during operation of the power switch; and
measuring, by a current limitation circuit, an output current of the power switch, the current limitation circuit coupled to a gate driver and the controller, the gate driver configured to be coupled to the power switch; and
regulating, by the current limitation circuit, a gate-source voltage of the power switch through the gate driver when the output current exceeds the threshold value.

* * * * *